(12) United States Patent
AbdelHafez (10) Patent No.: US 12,028,034 B2
(45) Date of Patent: Jul. 2, 2024

(54) ACCURATE CALIBRATION OF ANALOG INTEGRATED-CIRCUITS CONTINUOUS-TIME COMPLEX FILTERS

(71) Applicant: Synopsys, Inc., Mountain View, CA (US)

(72) Inventor: Mohammed Tawfik Mahmoud Mohammed AbdelHafez, Cairo (EG)

(73) Assignee: Synopsys, Inc., Sunnyvale, CA (US)

( * ) Notice: Subject to any disclaimer, the term of this patent is extended or adjusted under 35 U.S.C. 154(b) by 167 days.

(21) Appl. No.: 17/708,863

(22) Filed: Mar. 30, 2022

(65) Prior Publication Data

US 2022/0321105 A1 Oct. 6, 2022

Related U.S. Application Data

(60) Provisional application No. 63/168,495, filed on Mar. 31, 2021.

(51) Int. Cl.
| | |
|---|---|
| *H03H 7/00* | (2006.01) |
| *H03H 7/01* | (2006.01) |
| *H03H 11/12* | (2006.01) |
| *H03M 1/10* | (2006.01) |
| *H03H 11/04* | (2006.01) |

(52) U.S. Cl.
CPC ........ *H03H 11/126* (2013.01); *H03H 7/0153* (2013.01); *H03M 1/1047* (2013.01); *H03H 2007/0192* (2013.01); *H03H 2011/0494* (2013.01)

(58) Field of Classification Search
CPC ............. H03H 2007/0192; H03H 7/00; H03H 7/0153; H03M 1/1047; H03M 1/10; H03M 1/06
USPC ........................................ 327/551, 552, 553
See application file for complete search history.

(56) References Cited

U.S. PATENT DOCUMENTS

| | | | |
|---|---|---|---|
| 8,166,084 B2 * | 4/2012 | Hahn ................... | H03H 7/0153 708/3 |
| 9,780,756 B2 * | 10/2017 | Maxim ................... | H03F 1/565 |
| 11,201,600 B1 * | 12/2021 | Steinbrecher ............ | H03H 7/12 |

\* cited by examiner

*Primary Examiner* — Hai L Nguyen
(74) *Attorney, Agent, or Firm* — JAQUEZ LAND GREENHAUS & MCFARLAND LLP; Bruce W. Greenhaus, Esq.

(57) ABSTRACT

A first and second input tone are applied to a continuous-time complex filter within an integrated circuit. The magnitude of the output of the filter at the frequency of each of the first and second input tones are measured and compared to determine the value of a filter tuning control signal. A tuning control signal is applied to the filter with the determined value to tune the filter.

14 Claims, 13 Drawing Sheets

ACCURATE CALIBRATION OF ANALOG INTEGRATED-CIRCUITS CONTINUOUS-TIME COMPLEX FILTERS

CROSS-REFERENCE TO RELATED APPLICATIONS—CLAIM OF PRIORITY

The present application claims priority to U.S. Provisional Application No. 63/168,495, filed Mar. 31, 2021, entitled "Accurate Calibration of Analog Integrated-Circuits Continuous-Time Complex Filters", which is herein incorporated by reference in its entirety.

TECHNICAL FIELD

The present disclosure relates to fabrication of integrated circuits and more particularly to calibration of filters within integrated circuits after fabrication of the integrated circuit.

BACKGROUND

Semiconductor Integrated-Circuits (ICs) are used in most of the electronic equipment that is sold today. The fabrication tolerances in ICs are large. Accordingly, circuit characteristics vary greatly from one fabrication lot to another. Such process variations can have a negative impact on the performance of analog circuits within an IC. One common practice is to design an analog circuit and automatically adjust its characteristics to restore its performance after fabrication. Restoration of the performance is commonly called calibration or tuning. One component within many common ICs that is particularly susceptible to process variations is a continuous-time complex filter. Continuous-time complex filters are common building blocks in wireless ICs. There is currently no accurate method for tuning continuous-time complex filters. Therefore, in light of the current need for such accurate tuning, it would be desirable to provide a method that accomplishes this goal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to accurate tuning (i.e., calibration) of analog integrated-circuits continuous-time complex filters. In some embodiments of the presently disclosed method and apparatus, accurate tuning of continuous-time complex filters is accomplished by probing the filter response itself.

The analog filter is a common building block in integrated circuits (ICs). The filter passes a desired signal that may be carrying important information, while filtering out significant amounts of noise that might otherwise interfere with the signal. Such filters have many applications. For example, in wireless communication systems, weak desired signals are received and strong undesirable interfering signals need to be filtered out. Continuous-time complex filters are a common type of filter that are implemented in wireless communication system ICs.

It is typically the design goal of filters in the front end of a wireless communication system to remove as much as possible of the noise and the unwanted signals, while concurrently reducing any attenuation of the desired signals by the filter. However, fabrication tolerances cause deviations from a filter response designed to achieve these goals. After fabrication of an IC, attenuation of the desired signal may occur due to such deviations in the filter response. Additionally, some unwanted signals may not be sufficiently attenuated.

In some cases, the desired filter response is restored by tuning the filter based on probing characteristics of a replica sub-circuit that has been fabricated on the chip. The replica sub-circuit is typically part of the filter circuit. By making on-chip measurements, fabrication errors can be quantified and compensation can be provided. In some such cases, compensation is performed using programmable controls that alter the filter response. However, this approach is limited by the ability to match the replica sub-circuit to the counterpart in the filter. This is due to inevitable mismatches between devices fabricated on the same chip. Differences between the operational characteristics of the replica sub-circuit and the target filter for which compensation is being provided, result in values being set for the programmable controls that fail to perfectly restore the desired filter response.

It would be preferable to tune the filter itself without the need for reconfiguration. However, this approach has not been applicable to complex filters. That is, in some cases, this approach proves to be inaccurate when applied to complex filters.

Continuous time filters implemented in ICs tend to have large variations in the magnitude of the signal at the output of the filter generated in response to an input signal over a range of frequencies and/or time (sometime referred to as magnitude frequency response or magnitude profile). This is due to high tolerances that accompany fabrication of the ICs. Accordingly, it is desirable to implement techniques to tune (i.e., calibrate) the filter to correct the magnitude frequency response and thus return the response of the filter to the response that was intended when the filter was designed.

Three techniques are disclosed herein for tuning the filter. The first technique is similar to the technique noted above, in which a replica sub-circuit of the filter is calibrated. Calibration of the replica sub-circuit can then be used to inform the calibration of the actual filter.

Figure 1A:
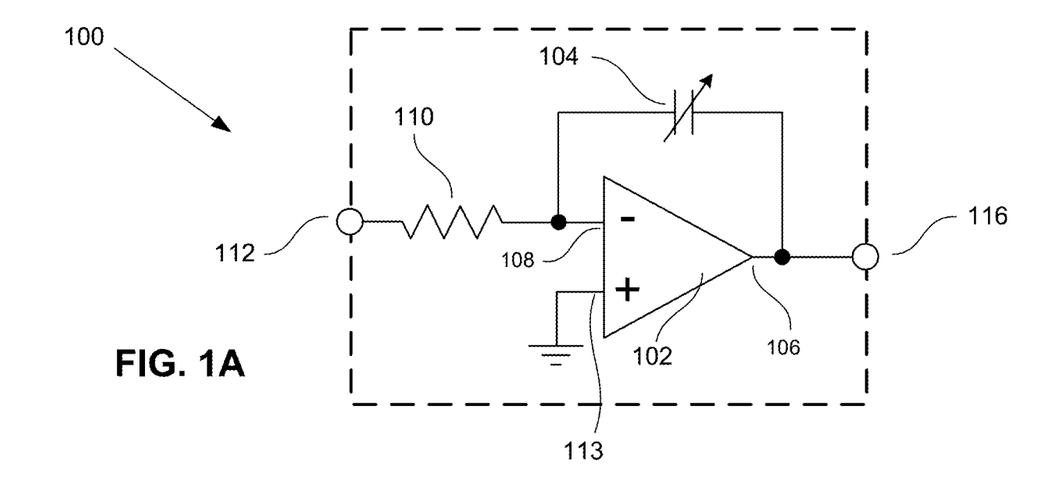
FIG. 1A is a simplified schematic diagram of a filter sub-circuit.

FIG. 1A is a simplified schematic diagram of the actual filter sub-circuit 100. An operational amplifier 102 is configured to have capacitive feedback through a variable capacitor 104 coupled between the amplifier output 106 and the amplifier's negative input port 108. A resistor 110 is coupled between a filter's sub-circuit input port 112 and the amplifier's negative input port 108. A positive amplifier input port 113 is coupled to a reference potential, such as ground.

Figure 1B:
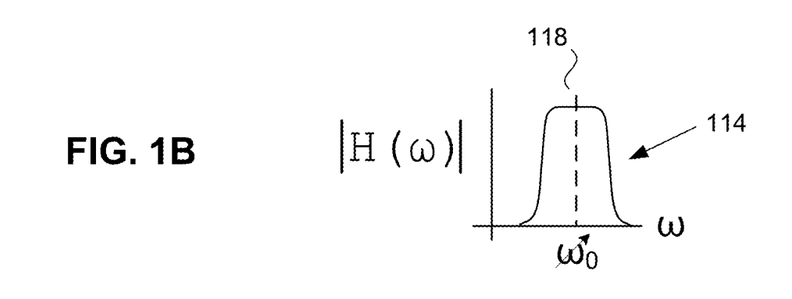
FIG. 1B shows the resulting magnitude frequency response in which the magnitude of the output H(ω) provided at the filter output port 116 is plotted along the y-axis and frequency ω is plotted along the x-axis.

FIG. 1B shows the resulting magnitude frequency response 114, in which the magnitude of the output $|H(\omega)|$ provided at the filter output port 116 is plotted along the y-axis and frequency $\omega$ is plotted along the x-axis. The center frequency 118 is shown at the frequency $\omega_0$. An arrow through the symbol "$\omega_0$" indicates that the center frequency $\omega_0$ is variable in response to tuning the variable capacitor 104.

Figure 2:
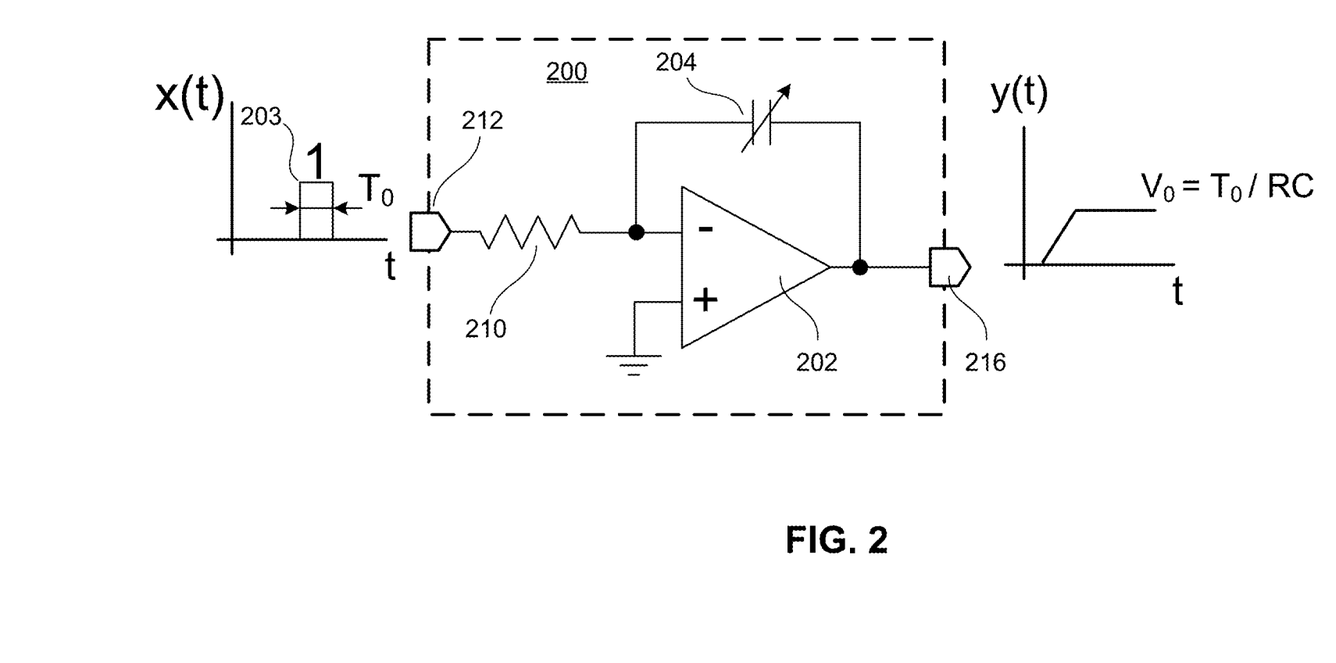
FIG. 2 is a simplified schematic diagram of a replica sub-circuit.

FIG. 2 is a simplified schematic diagram of a replica sub-circuit 200. A similar operational amplifier 202, variable capacitor 204 and resistor 210 are configured in similar fashion to the filter sub-circuit 100. A voltage pulse 203 is applied to the input port 212 of the replica sub-circuit 200. A response is seen at a sub-circuit output port 216 of the replica sub-circuit 200. The response will have a voltage $V_0 = T_0/RC$, where:

$V_0$ is the steady-state voltage at the sub-circuit output port 216;

$T_0$ is the duration of the pulse 203;

R is the resistance of the resistor 210; and

C is the capacitance of the variable capacitor 204.

The measured voltage at the sub-circuit output port 216 can be used to determine the amount of capacitance to be presented in the feedback between the output 106 of the amplifier 102 and the negative input port 108 of the amplifier 102 to tune the filter containing the sub-circuit 100 to the desired center frequency. However, as noted above, the accuracy of this approach is limited due to the fact that the replica sub-circuit cannot be perfectly matched with the actual filter. One reason for such mismatching is the difference between the resistance presented by the resistor 210 in the replica sub-circuit 200 and the resistor 110 in the sub-circuit 100. This mismatch makes it difficult or impossible for the sub-circuit 100 to be perfectly tuned using information attained by characterizing and tuning the replica sub-circuit 200.

In accordance with the second technique, the filter is directly tuned. In the second technique there is no replica circuit, however, it is only useful with low-pass filters. In one example of direct tuning, a square wave is input to the filter and specific quantities in the unique low-pass filter response are measured.

The third technique uses direct tuning with complex filters and involves digital auto-tuning schemes for second-order Gm-C bandpass filters that are suitable for fine CMOS implementation. A switched Gm-C analog filter and two digital tuning schemes are provided. The first of the two digital tuning schemes is a center frequency tuning scheme using the phase information. The second digital tuning scheme is a Q factor tuning scheme using the magnitude information. It should be noted that the third technique is also sufficiently inaccurate as to make it undesirable in at least some instances. The third technique relies on the filter having a zero phase response at its center frequency. However, this is only valid for ideal filters. The realized phase response often deviates from zero.

Figure 3A:
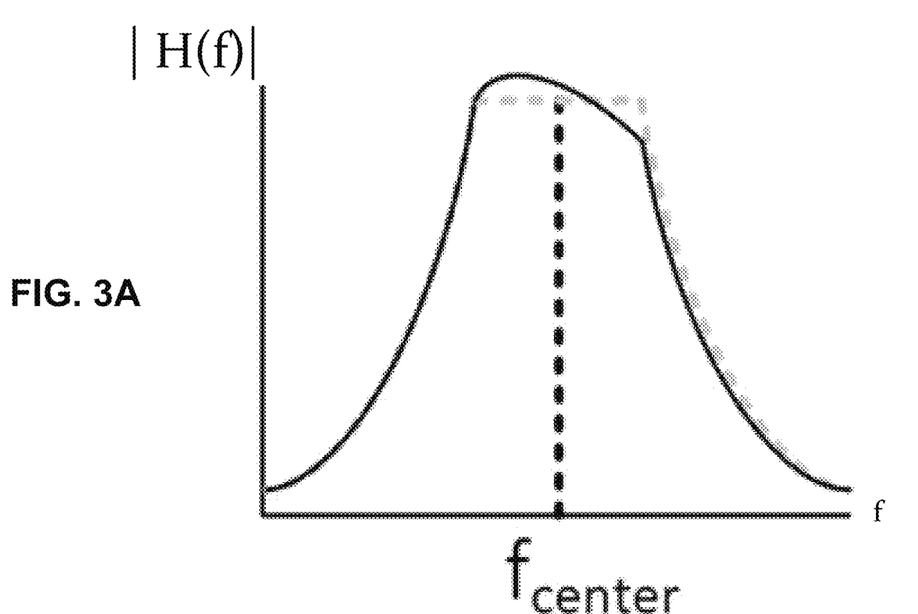
FIG. 3A shows the plot of a magnitude frequency response of a filter over a frequency range.
Figure 3B:
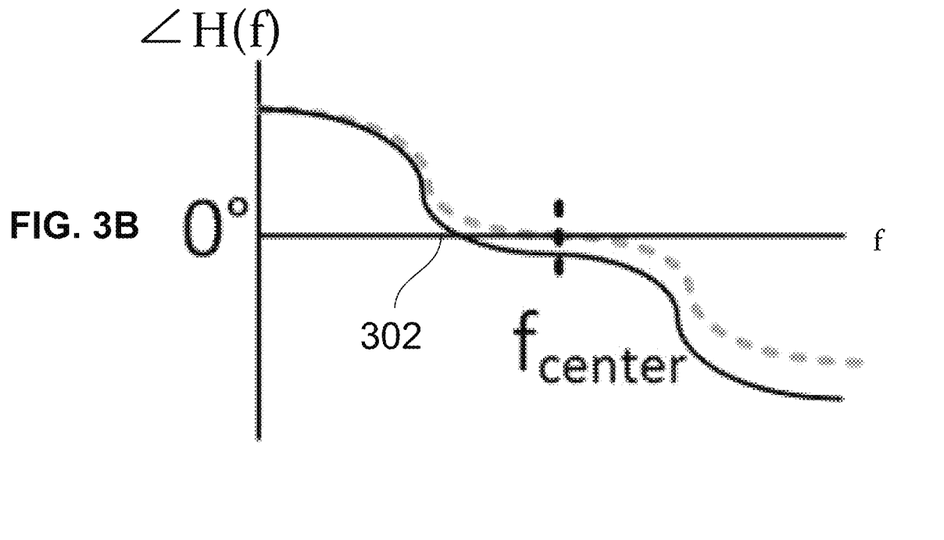
FIG. 3B shows a plot of the phase of the response of a filter over a frequency range.

FIGS. 3A and 3B show an example of the magnitude and phase frequency response of the filter. The realized phase response depicted in the figures show a deviation from zero.

FIG. 3A shows the plot of the magnitude frequency response H(f) over frequency f. FIG. 3B shows a plot of the phase of the response over frequency f. The 0° phase point 302 occurs at a frequency f that is substantially lower than the center frequency $f_{center}$. In addition, the zero phase value will typically change with variations in the fabrication process.

Figure 4:
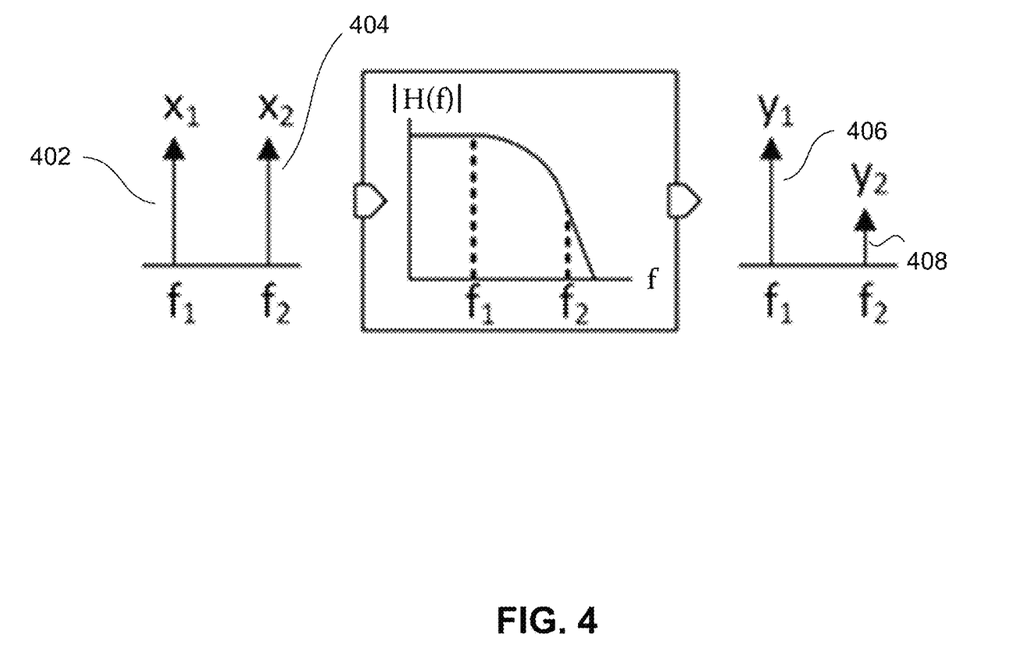
FIG. 4 shows a technique that uses direct tuning in which two identical-magnitude tones are applied to a filter input, one at a time.

FIG. 4 shows an example of a two-tone technique that uses direct tuning in which two identical-magnitude tones 402, 404 are applied to a filter input, one at a time. The frequency $f_1$ of the first tone 402 is within the filter's pass band, while the frequency $f_2$ of the other tone is within the transition band. The magnitude of each tone 406, 408 at the output of the filter is measured. The ratio of the magnitude of the first output tone 406 to the magnitude of the second output tone 408 is a function of the corner frequency of the filter. Controls that can be used to tune the filter are modified until the ratio of the two output tones 406, 408 equals a value indicative of the desired filter corner frequency.

Figure 5:
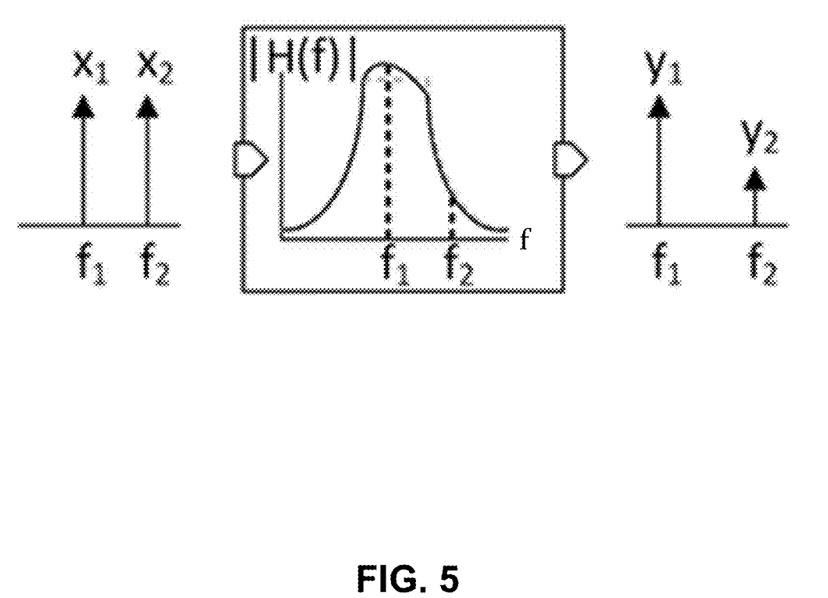
FIG. 5 shows an example of the fact that when the technique of FIG. 4 is used to tune a complex filter, the resulting tuning of the filter tends to be inaccurate.

FIG. 5, however, shows that when the two-tone technique of FIG. 4 is used to tune a complex filter, the resulting tuning of the filter tends to be inaccurate. The pass band magnitude profile of the complex filter usually deviates from that which was intended in the design. Furthermore, the deviation is not constant, but rather depends on the amount of variation in the fabrication process, and so ultimately on the fabrication tolerances. Thus, the ratio between the magnitudes of the output tones is not only a function of the filter's corner frequency, but also a function of the fabrication process corners.

Figure 6:
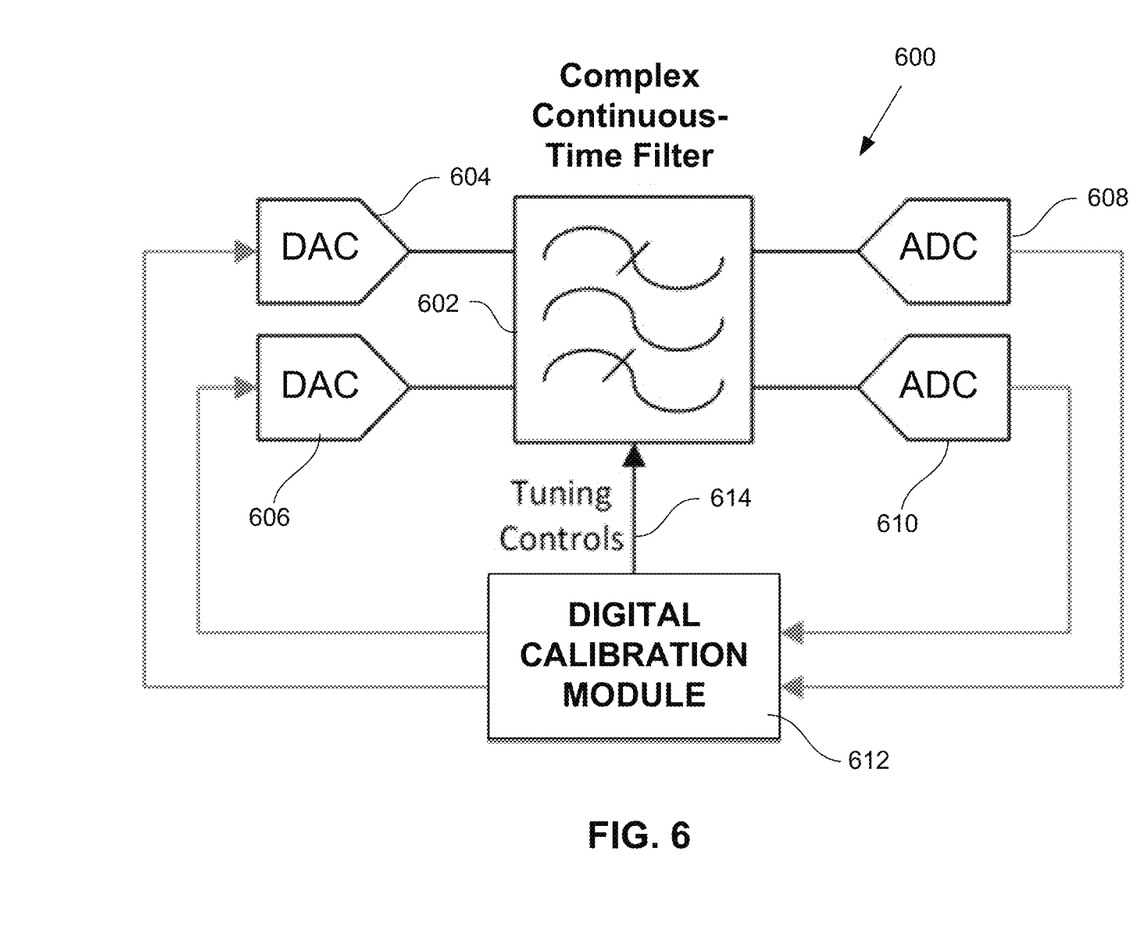
FIG. 6 illustrates an embodiment of a filter tuning system in accordance with some embodiments of the disclosed method and apparatus.

FIG. 6 illustrates an embodiment of a filter tuning system 600 in accordance with some embodiments of the disclosed method and apparatus. The system 600 uses direct tuning to calibrate a complex continuous-time filter 602. The filter has an input port, an output port and a tuning control port. In some embodiments, such as the embodiment depicted in FIG. 6, the system 600 comprises two Digital-to Analog Converters (DACs) 604, 606, two Analog-to-Digital Converters (ADCs) 608, 610 and a digital calibration module 612. Accordingly, the input port has two inputs and the output port has two outputs.

Figure 7:
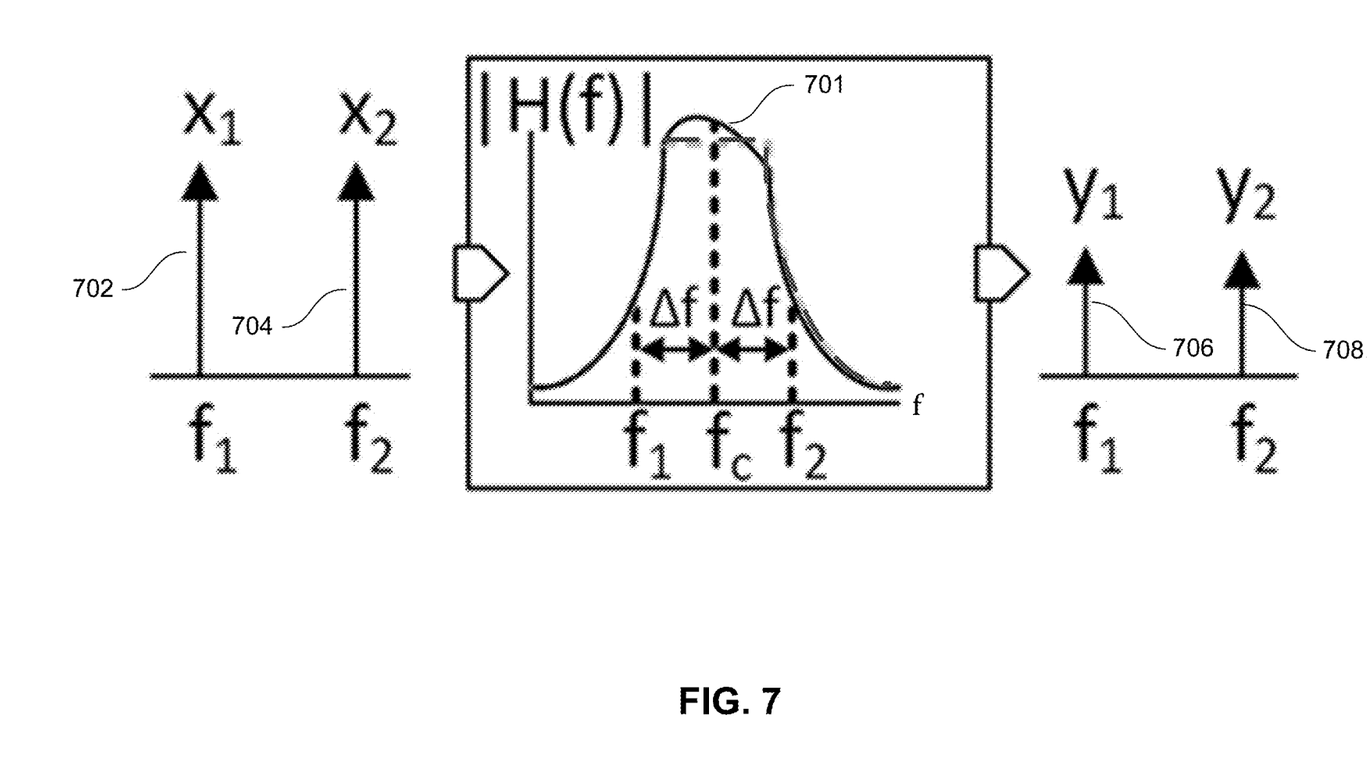
FIG. 7 illustrates the magnitude profile for a filter and associated input and output signals.

FIG. 7 illustrates the magnitude profile 701 for filter 602 and associated input and output signals 702, 704, 706, 708. In this direct tuning technique two test tones 702, 704 with frequencies $f_1$ and $f_2$ are applied to the input of the filter 602, similar to the two-tone technique disclosed above with respect to FIGS. 4 and 5. However, in some embodiments the test tones 702, 704 each have an equal offset frequency $\Delta f$ with respect to the desired center frequency $f_c$ of the filter. In some embodiments, the offset frequency of the first tone places the frequency $f_1$ in the lower transition band of the filter. That is, the desired frequency response of the filter is designed such that, at the frequency $f_1$, the output from the filter 602 is attenuated from the level at the output of the filter 602 at the desired center frequency $f_c$. Similarly, the second frequency $f_2$ is offset from the desired center frequency by an offset frequency that places the second frequency $f_2$ in the upper transition band of the filter. Accordingly, the desired filter response will result in the input signal at $f_2$ being attenuated from the level at the output of the filter 602 at the desired center frequency $f_c$.

In some embodiments, tuning is performed by digital circuitry, such as digital calibration module 612. Data converters, such as the DACs 604, 606, and ADCs 608, 610 interface the digital calibration module 612 with the filter 602. Although the data converters 604, 606, 608, 610 may have offset and gain errors, as well as non-linear errors, such errors can be decreased by enhancing the design of the converters, which is not dependent upon the filter design. The output of the filter is measured by the calibration module 612 with the first and second tones $f_1$, $f_2$ applied to the input of the filter 602. A desired value of a tuning control signal 614 applied by the digital calibration module 612 is determined by the digital calibration module 612 to tune the filter in response to the measurement of the output signal from the filter 602 in response to the measurements of the two tones. The measurement is provided to the digital calibration module 612 as measured by the ADCs 608, 610. Accordingly, the filter 602 is tuned to the desired frequency response.

Figure 8:
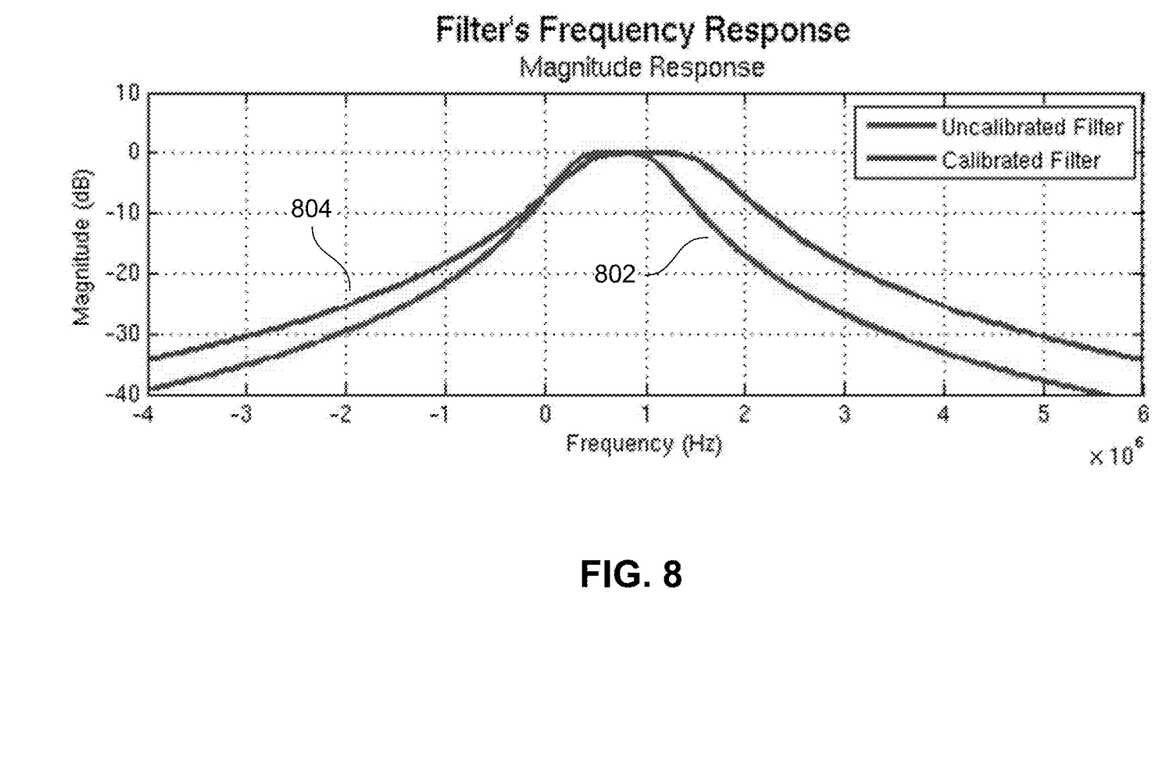
FIG. 8 shows magnitude frequency response curves for both an uncalibrated filter and a calibrated filter.

FIG. 8 shows magnitude frequency response curves for both an uncalibrated filter (curve 802) and a calibrated filter (curve 804). In some embodiments, the filter 602 is part of a low-IF (low intermediate frequency) integrated receiver. In some such embodiments, the desired center frequency of the filter is designed to be at approximately 1 MHz, but can vary down to a center frequency of 700 kHz due to fabrication tolerances. Preferably, the center frequency is restored to 1 MHz by varying the tuning controls of the filter. For example, in some embodiments this might be done by varying the feedback capacitance 104 in all of the filter sub-circuits such as the sub-circuit 100 shown in FIG. 1. In some such embodiments, the feedback capacitance 104 is established by a filter capacitor bank (not shown). The number of the active unit capacitors inside the filter's capacitor bank that are active in the feedback circuit is determined by a tuning control signal 614 provided by the digital calibration module 612 (see FIG. 6).

In some embodiments, the digital calibration module 612 follows a binary search algorithm to determine the optimum value for the tuning control signal 614 (e.g., the capacitance in the feedback loop of the filter). In each iteration of the binary search, the digital calibration module 612 tests the symmetry of the filter's magnitude profile 701 about the desired center frequency $f_c$, 1 MHz in this example. After testing, within each iteration, the digital calibration module 612 determines whether to either increase or decrease the tuning control value, to restore the symmetry of the profile 701.

Figure 9A:
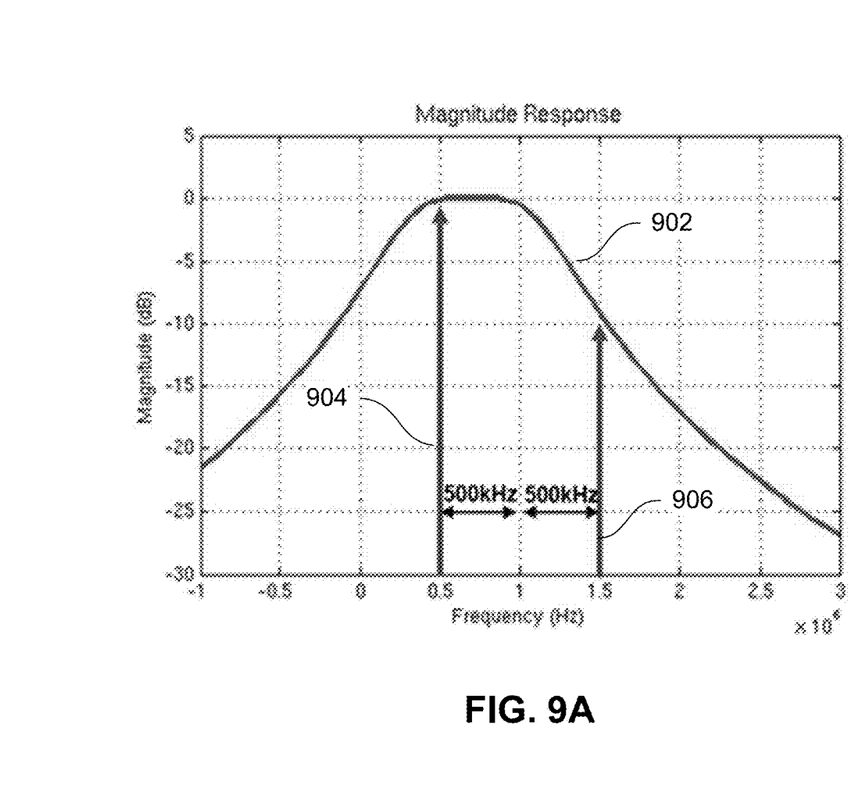
FIG. 9A is a graph showing a plot of the magnitude frequency response profile at the filter output for one filter and magnitudes of two input tones applied to the filter input.
Figure 9B:
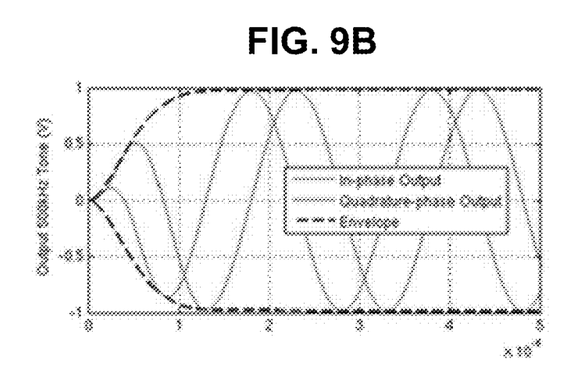
FIG. 9B shows the transient envelope of the in-phase and quadrature-phase output signals when the low-frequency tone is applied to the filter.
Figure 9C:
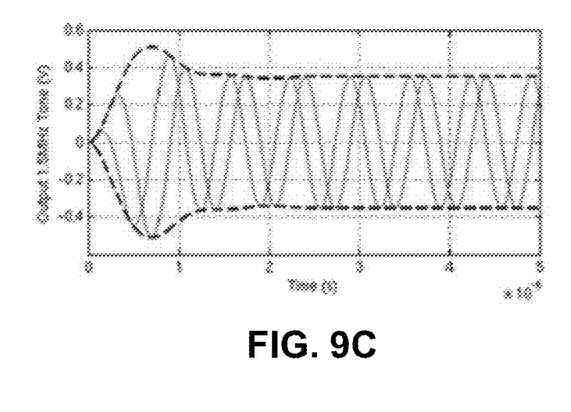
FIG. 9C shows the transient envelope of the in-phase and quadrature-phase output signals when the high-frequency tone is applied to the filter.

FIG. 9A is a graph showing a plot of the magnitude frequency response profile 902 at the filter output for one filter and magnitudes of output tones 904, 906 at the output of the filter in response to two input tones applied to the filter input. The symmetry of the magnitude profile 902 can be tested by application of either sinusoidal tones or narrow-band test signals at the input of the filter, using the DACs 604, 606. When applying sinusoidal tones, the profile symmetry is tested by comparing the amplitudes of the output tones 904, 906. FIG. 9B shows the transient envelope of the in-phase and quadrature-phase output signals when the low-frequency tone is applied to the filter. FIG. 9C shows the transient envelope of the in-phase and quadrature-phase output signals when the high-frequency tone is applied to the filter. In some embodiments, the first and second tones are applied consecutively. That is, a first of the two tones is applied and the output of the filter is measured, then the second of the two tones is applied and the output of the filter is measured. Alternatively, in some embodiments, the first and second tones are applied concurrently. The measurements at the output of the filter in response to each of the two tones being applied to the filter input is used to determine the value of the tuning control signal.

Figure 10A:
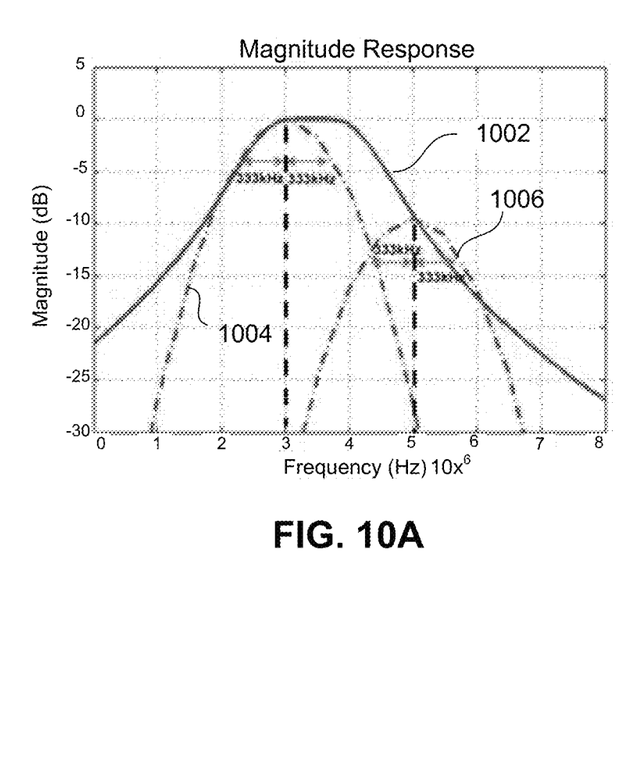
FIG. 10A is a graph showing a plot of the magnitude frequency response profile at the filter output for one filter and magnitudes of two narrow-band input signals applied to the filter input.
Figure 10B:
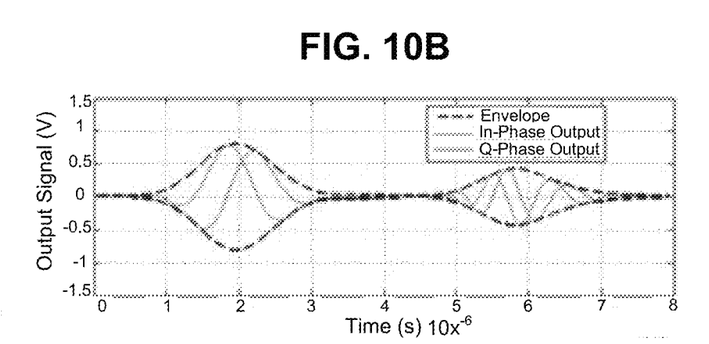
FIG. 10B shows the transient envelope of the in-phase and quadrature-phase output signals when the two narrow-band signals are applied to the filter successively.
Figure 10C:
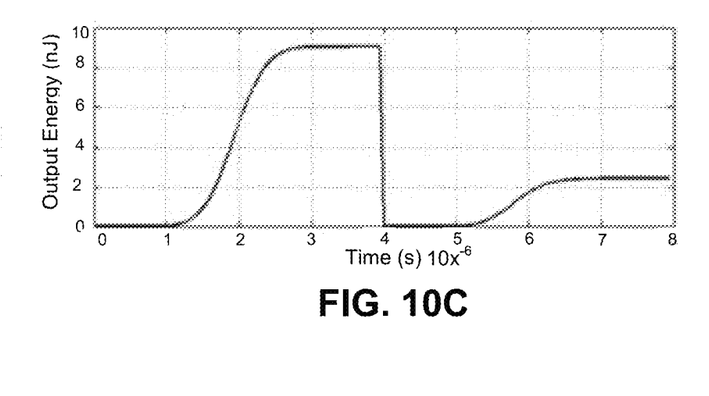
FIG. 10C shows the successive transient energy pulses corresponding to the output signals.

FIG. 10A is a graph showing a plot of the magnitude frequency response 1002 of a filter and the frequency of two narrow band signals 1004, 1006 applied to the input of the filter. When applying narrow-band signals, symmetry is tested by comparing the energies of the transient output pulses (See FIGS. 10B and 10C).

Figure 11:
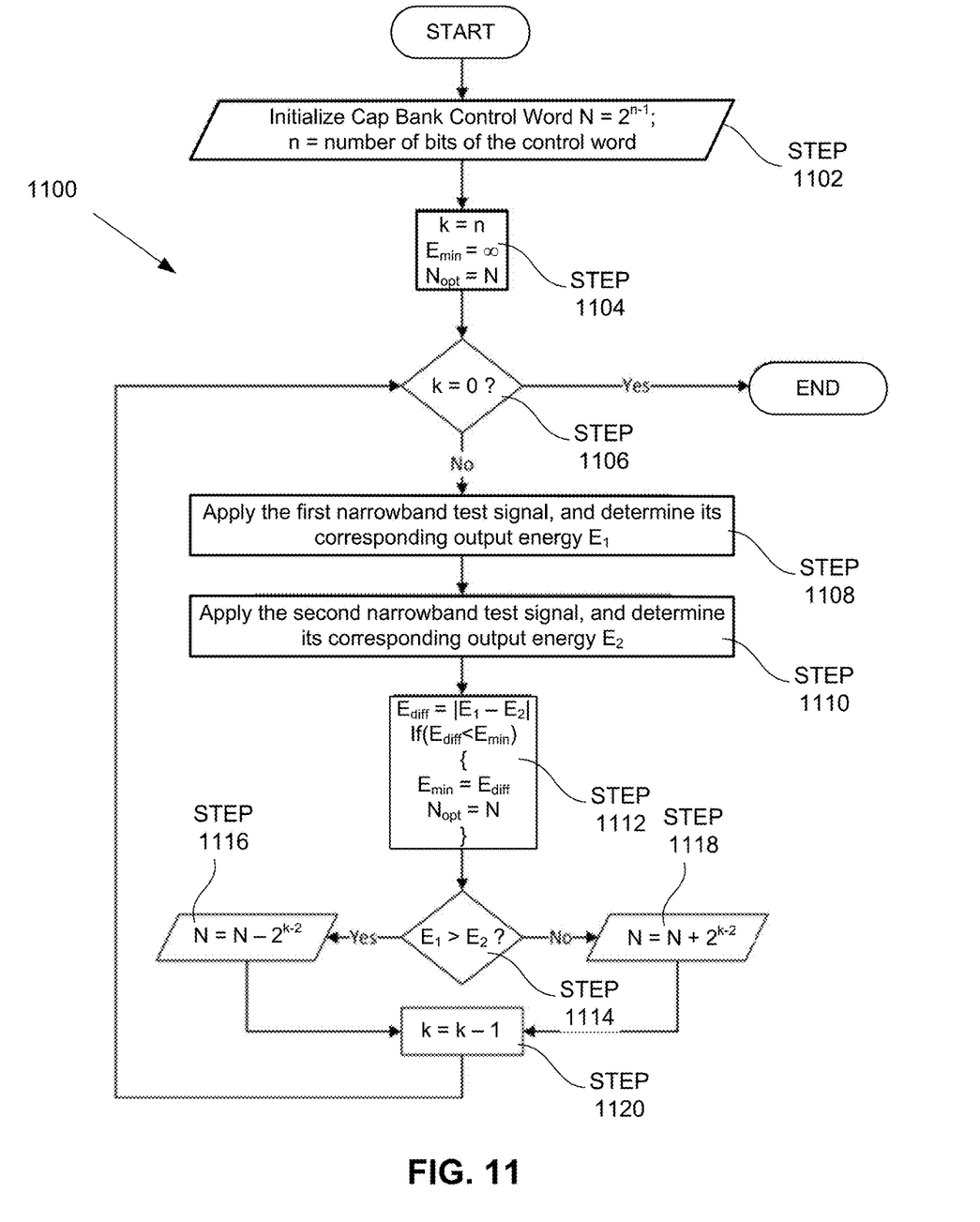
FIG. 11 shows a calibration flowchart incorporating narrow-band signals and a binary search algorithm.

FIG. 11 shows a flowchart of a calibration procedure 1100 incorporating narrow-band signals and a binary search algorithm. In the example provided, the tuning control signal 614 generated by a digital calibration module 612 (see FIG. 6) communicates a value to control a variable capacitor 104 in a filter 602. In some embodiments, the variable capacitor 104 is implemented as a capacitor bank (see capacitor bank 1206 of FIG. 12, discussed further below) within the filter 602.

In some embodiments, the tuning control signal 614 comprises a control word that is applied to the control input of the filter 602. In some embodiments, the control word comprises several bits that are applied in parallel to the filter 602 that determine the amount of adjustment to be applied to the filter response. The process starts with the control word variable "N" being initialized to a value that corresponds to the number of bits in a control word. In some embodiments, the control word variable N is initialized to $2^{n-1}$, where n is the number of bits of the control word (STEP 1102). Next, a process variable "k" is initialized to the value of n; the minimum energy value $E_{min}$ is initialized to infinity; and the number of active unit capacitors in the capacitor bank $N_{opt}$ is initialized to N (STEP 1104).

Figure 12:
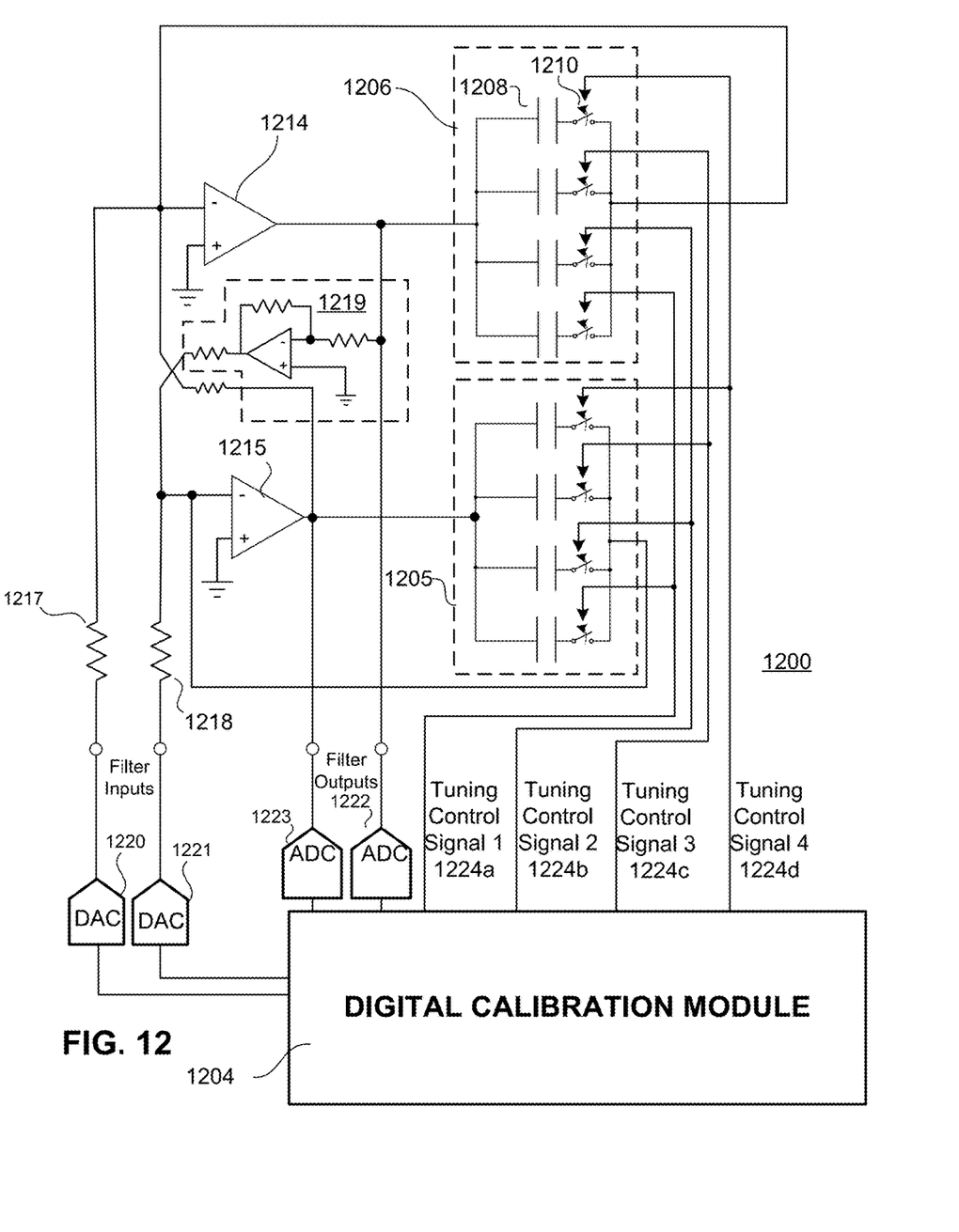
FIG. 12 is a simplified schematic of a filter and associated digital calibration module in accordance with one embodiment in which filter comprises a capacitor bank, operational amplifier and input filter resistor.

It should be noted that the relationship between the value N and the capacitance presented by the capacitor bank 1206 depends upon the values of each of the capacitors 1208 of the capacitor bank 1206. If the second capacitor 1208b in the bank 1206 has twice the capacitance of the first capacitor 1208a, and the third capacitor 1208c has twice the capacitance of the second capacitor 1208b, etc. then there will be a linear relationship between the value of N and the total capacitance of the capacitor bank 1206.

Once the value of $N_{opt}$ has been initialized, the process variable, k is checked to see whether it is equal to zero (STEP 1106). If true, then the process ends. If false, then the first narrowband test signal is applied to the filter and the corresponding output energy $E_1$ is determined (STEP 1108). Next, the second narrowband test signal is applied to the filter and the corresponding output energy $E_2$ is determined (STEP 1110). Having determined the output energies $E_1$ and $E_2$, the difference, $E_{diff}$ between these two energy levels is determined. If $E_{diff}$ is less than the current value of $E_{min}$, then the value of $E_{min}$ is set to the value of $E_{diff}$ and the value of $N_{opt}$ is set to the value of N (STEP 1112). Next, a determination is made as to which of the energy levels $E_1$ or $E_2$ is greater (STEP 1114). If $E_1$ is greater, then the value of N is reduced to $N-2^{k-2}$ (STEP 1116), thus adjusting the value of the feedback capacitance 104 as determined by the value of the tuning control signal 614 and so moving the filter response in the desired direction to correct for any offset in the filter response. Alternatively, if $E_2$ is greater, than the value of increased to $N+2^{k-2}$ (STEP 1118). Upon updating the value of N, the value of the process variable k is decremented by one (STEP 1120). The process then returns to STEP 1106 to determine whether the value of the process variable, k has reached zero, indicating the end of the procedure. If not, then the procedure repeats STEPs 1108 through 1120.

FIG. 12 is a simplified schematic of a filter sub-circuit 1200 and associated digital calibration module 1204 in accordance with one embodiment in which sub-circuit 1200 comprises a first capacitor bank 1206, a second capacitor bank 1205, a first operational amplifier 1214, a second operational amplifier 1215, a third operational amplifier and associated resistor network 1219, a first input filter resistor 1217 and a second input filter resistor 1218. Each capacitor bank 1205, 1206 comprises at least two capacitors 1208 and capacitor switches 1210. Each capacitor 1208 is coupled in series with an associated capacitor switch 1210. Each capacitor switch 1210 is controlled by a tuning control signal 1224 generated by the digital calibration module 1204. By selectively opening or closing the switches 1210, the total amount of capacitance can be selected for each capacitance bank 1205, 1206, and thus the total amount of capacitance to be coupled between the output of each operational amplifier 1214, 1215 and the inverting input of each operational amplifier 1214, 1215. In some embodiments, the capacitors 1208 have the same capacitance value. In other embodiments, the capacitance of each capacitor 1208 may be different from one or more of the other capacitors 1208. By controlling the capacitance, the sub-circuit 1200 can be tuned. In the embodiment shown in FIG. 12, there are four capacitors 1208 in each capacitor bank 1205, 1206 and four associated tuning control signals 1224 that control both banks 1205, 1206. However, any number greater than 1 can be used. Input signals may be coupled from the digital calibration module 1204 to the filter input (i.e., through the input filter resistors 1217, 1218). In some embodiments, the digital calibration module 1204 outputs digital signals that are converted to analog signals by DACs 1220, 1221 prior to being coupled to the respective input filter resistors 1217, 1218. In some embodiments, the two input signals are in-phase and quadrature signals that are presented to the sub-circuit 1200, as noted above. In addition, the outputs of the sub-circuit 1200 are coupled back to the digital calibration module 1204 through two ADCs 1222, 1223 that convert analog in-phase and quadrature output signals to digital signals that are then coupled to the digital calibration module 1204.

FIGS. 13A-13E show waveforms associated with the method of FIGS. 11 and 12.

Figure 13A:
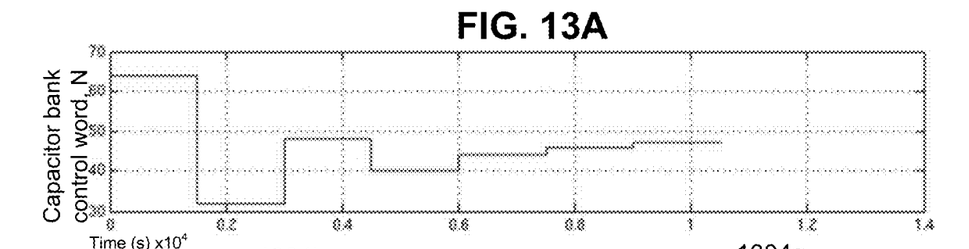
FIGS. 13A-13E show waveforms associated with the method of FIGS. 11 and 12.

FIG. 13A shows the value, N of the capacitor bank control word applied to the capacitance bank 1206 by the digital calibration module 1204 over the tuning control signal lines 1224. It should be noted that reference numbers provided in the figures that have a common numeric portion and varied alphabetic portion refer to various instances of the same element. For example, there are four tuning control signal lines 1224a, 1224b, 1224c and 1224d, each being similar to the others. Furthermore, these various elements can be referenced collectively using only the numeric portion of the reference number. For example, all four of the tuning control signal lines can be referred, collectively, to as "tuning control signal lines 1224".

The value of N steps through various values applied over time during the calibration process, such as the process shown in the flowchart of FIG. 11. The value of the tuning control signal lines is initially set to the value equal to $2^{n-1}$. In the example shown in FIGS. 13A-13E, the value n is equal to 7. Accordingly, the initial value of N is set to $2^6=64$.

Figure 13B:
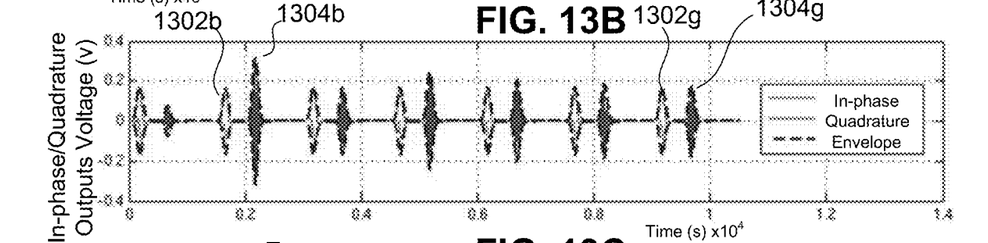

FIG. 13B shows the analog signal output waveform 1302 when the filter input is the first narrowband signal and the analog signal output waveform 1304 when the filter input is the second narrowband signal. It can be seen that the output energy $E_1$ due to the first narrowband test signal application is higher than the output energy $E_2$ due to the second narrowband test signal application with the value of N equal to 64. Accordingly, the value of N is updated by subtracting $2^{k-2}=2^5=32$. Therefore, the resulting value for N is 32.

Figure 13C:
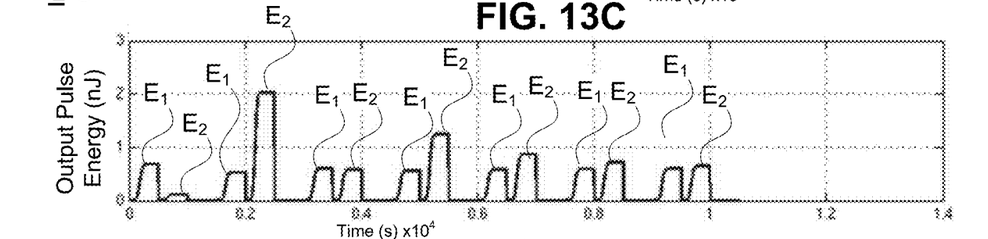

FIG. 13C plots the pulse energy $E_1$, $E_2$ of the two output signals associated with the envelopes of the analog signals shown in FIG. 13B and in response to the amount of capacitance coupled in the feedback of the filter, as shown in FIG. 13A. This plot shows the output pulse energy $E_1$ of the first test signal being higher than the energy of the second test signal $E_2$ with the value of N=64. The second time the test signals are measured (i.e., after updating the value of N to 32) the difference between the two test signals becomes significantly larger, with $E_2$ being greater than $E_1$.

Figure 13D:
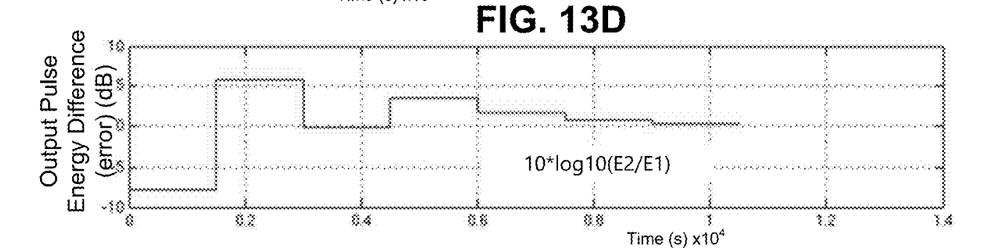

FIG. 13D plots the relative difference between the energy of $E_1$ and the energy of $E_2(10*\log_{10}(E2/E1))$ in decibels (dB) over the course of the procedure. The difference polarity is inverted when N changes from 64 to 32.

Figure 13E:
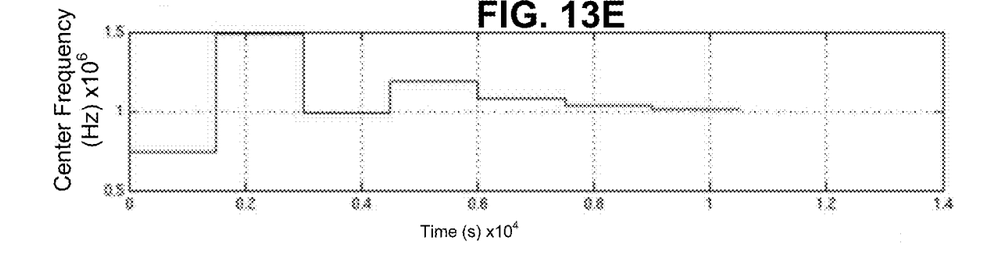

FIG. 13E plots the filter response center frequency in Hertz over the course of the procedure 1100 shown in the flowchart of FIG. 11. At the end of calibration procedure, the filter's center frequency is restored. With N=64, the center frequency is offset from the desired center frequency by approximately 250 kHz. Upon updating N to 32, the offset of the center frequency from the desired center frequency becomes approximately 500 kHz.

The second time through the process 1100, the value of k is 6, since $E_2$ was greater than $E_1$, the value of N is increased by $2^{k-2}=2^4=16$. That results in a value of N of 32+16=48, as shown in FIG. 13A. From FIGS. 13B, 13C and 13D we see that the difference between the energy levels of $E_1$ and $E_2$ is much less. Accordingly, it should be noted that by the third time through STEP 1108 of the procedure 1100, the center frequency is nearly at the desired frequency, the difference between the energy of $E_1$ and $E_2$ is minimal (as shown in FIGS. 13B, 13C and 13D), and the value applied to the capacitor bank 1206 is nearly at the same value as is established at the end of the procedure. Nonetheless, the procedure continues until the process value k reaches zero in STEP 1120. Each time the procedure 1100 performs STEP 1112, the update to the value of N is a smaller change than the previous time STEP 1112 was performed, allowing the value of the capacitance presented to the filter 1200 by the capacitor bank 1206 to approach the desired value. That is, the procedure starts by setting the value of the most significant bit of the value of N to "1" (i.e., setting the value of $N=2^{n-1}=64$, where n=7, which represents the number of bits in the control word). The value of N is then adjusted by half the initial value of N (i.e., $2^{k-2}$). Each subsequent adjustment is by half the amount of the previous adjustment (with the adjustments either being additions or subtractions of $2^{k-2}$, depending upon the relative levels of $E_1$ and $E_2$, until the value of k is zero). It should be noted that when the value of k=1, the adjustment to N is not used, since the measurement of the test signal energy levels is made after decrementing k to zero in STEP 1120 and after checking in STEP 1106 to see whether the procedure is done. Therefore, the fact that the value of k−2 is negative in the last pass through STEP 1116/1118 is of no consequence.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
    applying to an input of a filter, a first tone having a first tone frequency that is less than a desired center frequency of the filter, and offset by a first offset frequency from the desired center frequency, the first offset frequency placing the first tone frequency in a lower transition band of the filter;
    applying to the input of the filter, a second tone having a frequency that is greater than, and offset by a second offset frequency from, the desired center frequency of the filter, the second offset frequency placing the frequency of the second tone in the upper transition band of the filter;
    measuring the output of the filter with the first and second tone applied to the input of the filter; and
    determining a value of a tuning control signal to tune the filter in response to the measured output signal from the filter.

2. The method of claim 1, wherein the first and second tones are applied consecutively.

3. The method of claim 1, wherein the first and second tones are applied concurrently.

4. The method of claim 1, wherein the tuning control signal comprises a control word and wherein determining the value of the tuning control signal comprises:
    initializing a control word variable, N, to a first value based on a number of bits of the control word;
    initializing a process variable, k, to a second value based on the number of bits in the control word;
    initializing an energy minimum variable $E_{min}$ to a value anticipated to be greater than the difference between the energy level measured at the filter output at the frequency of the first tone and the energy level measured at the filter output at a frequency of the second tone;
    setting a variable, $E_{diff}$ to a value that is proportional to the difference between the energy level measured at the filter output at the frequency of the first tone and the energy level measured at the filter output at the frequency of the second tone;

if $E_{diff}$ is less than $E_{min}$, setting $E_{min}$ to $E_{diff}$ and setting a tuning control output variable $N_{opt}$ equal to N;

determining whether the energy level measured at the filter output at the frequency of the first tone is greater than the energy level measured at the filter output at the frequency of the second tone;

if the energy level measured at the filter output at the frequency of the first tone is greater than the energy level measured at the filter output at the frequency of the second tone, then updating the value of the control word output variable, N to the previous value of N minus an amount that is dependent upon the value of the control variable, k and then decrementing the value of the control variable, k by a predetermined amount;

if the energy level measured at the filter output at the frequency of the first tone is not greater than the energy level measured at the filter output at the frequency of the second tone, then updating the value of the control word output variable, N to the previous value of N plus an amount that is dependent upon the value of the control variable, k and then decrementing the value of the control variable, k by a predetermined amount;

checking whether the value of the control variable, k indicates that the process is complete;

if the control variable, k indicates that the process is not complete, then repeating the above, starting at setting a variable, $E_{diff}$; and if the control variable, k indicates that the process is complete, then ending the process with the value of the tuning control signal being set to the value of the variable $N_{opt}$.

5. The method of claim 4, wherein the first value based on a number of bits of the control word, is equal to n, and n is equal to the number of bits in the control word.

6. The method of claim 4, wherein the second value based on the number of bits in the control word, is equal to $2^{(n-1)}$.

7. The method of claim 4, wherein N minus an amount that is dependent upon the value of the control variable, k is equal to $N-2^{(k-2)}$ and N plus an amount that is dependent upon the value of the control variable, k is equal to $N+2^{(k-2)}$ and wherein the amount by which k is decremented is 1.

8. The method of claim 1, wherein symmetry of a magnitude profile at the output of the filter is tested by the first and second tones being sinusoidal test signals.

9. The method of claim 8, wherein the symmetry is tested by comparing amplitudes of the output signals at the output of the filter.

10. The method of claim 1, wherein the tuning control signal is applied to a variable capacitor.

11. The method of claim 10, wherein the variable capacitor is a capacitor bank.

12. The method of claim 11, wherein the capacitor bank is within the filter.

13. The method of claim 1, wherein the first tone and the second tone are narrow band signals.

14. The method of claim 13, wherein symmetry is tested by comparing the energies of transient output pulses at the output of the filter.

* * * * *